(12) United States Patent
Henderson et al.

(10) Patent No.: US 6,305,258 B1
(45) Date of Patent: Oct. 23, 2001

(54) PUNCH ACTUATOR MONITORING SYSTEM AND METHOD

(75) Inventors: Donald W. Henderson, Ithaca; Edward F. Helinski, Johnson City, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/025,601

(22) Filed: Feb. 18, 1998

(51) Int. Cl.⁷ ................................ B26D 1/00; B26F 1/14
(52) U.S. Cl. ...................... 83/13; 83/72; 83/575; 83/686; 83/687
(58) Field of Search .................... 83/13, 72, 30, 83/575, 687, 686

(56) References Cited

U.S. PATENT DOCUMENTS

| | | | |
|---|---|---|---|
| 3,066,554 | * 12/1962 | Hanson | 83/687 |
| 3,477,317 | * 11/1969 | Liander | 83/687 |
| 3,750,502 | * 8/1973 | Ball | 83/687 |
| 3,930,248 | 12/1975 | Keller . | |
| 3,979,980 | 9/1976 | Biester et al. . | |
| 4,023,044 | 5/1977 | Miller et al. . | |
| 4,088,899 | * 5/1978 | Miller et al. | 83/13 |
| 4,199,727 | 4/1980 | Barnes . | |
| 4,347,786 | 9/1982 | Sweat, Jr. et al. . | |
| 4,813,320 | 3/1989 | Malloy et al. . | |
| 5,251,151 | 10/1993 | Demjanenko et al. . | |
| 5,256,010 | 10/1993 | Hehl et al. . | |
| 5,410,233 | * 4/1995 | Carbaugh, Jr. et al. | 83/575 |
| 5,586,041 | 12/1996 | Mangrulkar . | |
| 5,673,601 | * 10/1997 | Ejima et al. | 83/72 |
| 5,726,568 | * 3/1998 | Carbaugh, Jr. et al. | 83/575 |
| 5,905,352 | * 5/1999 | Carbaugh, Jr. et al. | 83/575 |
| 5,913,956 | * 6/1999 | Capps | 83/13 |
| 5,934,165 | * 8/1999 | Chatham | 83/686 |

* cited by examiner

Primary Examiner—M. Rachuba
(74) Attorney, Agent, or Firm—Connolly Bove Lodge & Hutz; Lawrence R. Fraley (57) ABSTRACT

A method and apparatus for detecting performance of an apparatus for punching holes in a substrate, ensuring hole quality and/or minimizing or eliminating damage to the films during the hole punching process.

15 Claims, 5 Drawing Sheets

PUNCH ACTUATOR MONITORING SYSTEM AND METHOD

FIELD OF THE INVENTION

The present invention relates to forming holes in a substrate. In particular, the present invention relates to mechanically punching holes in films, especially thin films for use in the electronics industry. More particularly, the present invention relates to a method and apparatus for ensuring hole quality and minimizing or eliminating damage to the films during the hole punching process.

BACKGROUND OF THE INVENTION

Some aspects of the fabrication of structures for use in the electronics industry require the formation of holes in a substrate. One method for forming such holes is to physically punch the holes in the substrate. Typically, the substrates are thin films.

Frequently, the punching of holes occurs while the punching device and the substrate move relative to each other. The movement of the punching device and the substrate may take place in both the X and Y directions. That is, movement may take place parallel to the plane of the substrate. Such movements along the axial directions are referred to as "punch-on-the-fly X" (POFX) and "punch-on-the-fly Y" (POFY).

During both POFX and POFY operations, there is at least some lateral component of movement of the punch and/or the substrate, or film or web, relative to each other while the punch is actually within the substrate, during the punch "in web time". This time interval is referred to as the web engagement time and refers to the interval during which the punch is mechanically engaged with the hole. The magnitude of the relative motion of the punching device and the substrate during this interval is dependent upon the velocity of the relative movements.

As a punch is used to produce holes in a substrate, it generates fine particles, much as a saw blade generates dust. These fine particles gather on the punch and punch guides, causing frictional drag on the movement of the punch. This problem is particularly important with punches that have slow actuation cycles. The debris can cause the actuation cycles to slow.

Clogging of punch guides, causing frictional drag on the movement of the punch, is also a particularly potentially damaging problem with POFX and POFY systems. For example, as the punch movement is delayed, the substrate and punch assembly continue to move relative to each other. This initially may cause only hole quality problems. However, as time goes on, the delayed punch movement can rip the substrate. Ripping of a substrate may necessitate discarding the entire substrate, or web or film. This can be a particularly costly problem, especially when ripping occurs near the end of a long web or film structure, but still results in discarding the entire web or film.

The frictional drag caused by a buildup of substrate material in the punch assembly can delay the initial stroke of the punch. The frictional drag may also delay the return stroke of the punch. In the most severe cases, the frictional drag on the movement of the punch may cause a failure of the punch to return at all.

Slowing of the punch cycle may also be caused by other conditions, such as punch and die edge wear. These wear conditions also increase the energy required to pierce the film, thus slowing the punch and decreasing the rebound velocity.

In view of the above, it is apparent that problems caused by punch slowdown, regardless of the cause, are costly problems.

SUMMARY OF THE INVENTION

Accordingly, one object of the present invention is to provide a method for detecting delays in the punch actuation process.

An advantage of the present invention is to stop punch firing if a delay in the punch actuation process is detected.

It follows that another advantage of the present invention is to help prevent damage to substrates being punched.

An additional object of the present invention is to mechanically decouple the punches vibrationally so as to permit isolated detection of punch movements.

In accordance with these and other objects and advantages, aspects of the present invention provide a method for minimizing transmission of vibrations among punch actuators for punching holes in a substrate. The method includes the step of decoupling mechanical vibrations between the punch actuators.

According to other aspects, the present invention provides an apparatus for mechanically forming holes in a substrate. The apparatus includes a plurality of punches for engaging the substrate and forming holes in the substrate. A plurality of punch actuators actuate the punches. The apparatus also includes means for vibrationally decoupling the punch actuators.

Additionally, aspects of the present invention provide a method for preventing mis-punching of holes in a substrate. The method includes sensing parameters related to the timing of movement of punches during a plurality of punching operations. A change in the parameters over time is detected. The change in the parameter values is compared to a predetermined value. The punching of holes is ceased when the detected change substantially differs from a predetermined value by a predetermined amount. Alternatively, the energy of the punch actuation may be increased to overcome the energy losses and reduce the measured delays.

The present invention also provides methods for preventing damage to the substrate during the punching of holes in the substrate, an apparatus for preventing mis-punching of holes in a substrate, and an apparatus for preventing damage to a substrate during punching of holes in the substrate.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

FIG. 4 represents a close-up cross-sectional view of an embodiment of an electromagnetic repulsion actuator that the present invention may be utilized with.

DETAILED DESCRIPTION OF BEST AND VARIOUS MODES FOR CARRYING OUT THE INVENTION

As discussed above, the present invention relates to mechanically punching holes in substrates. The present invention is particularly useful for preventing damage to substrates when mechanically punching holes in the substrates. In particular, the present invention is particularly useful for preventing damage to substrates used in the electronics industry. The present invention permits precise punching of minute, closely spaced apertures without improper aperture shape distortion and without destroying the substrate in which the apertures are formed.

For example, the present invention is particularly useful in preventing damage to thin substrates, such as thin dielectric film used in the electronics industry. Examples of such films include polyimide films. Such films are used to fabricate highly dense, circuitized substrates, such as thin, flexible circuits. Of course, the present invention may be utilized to form holes in any substrate.

Figure 1:
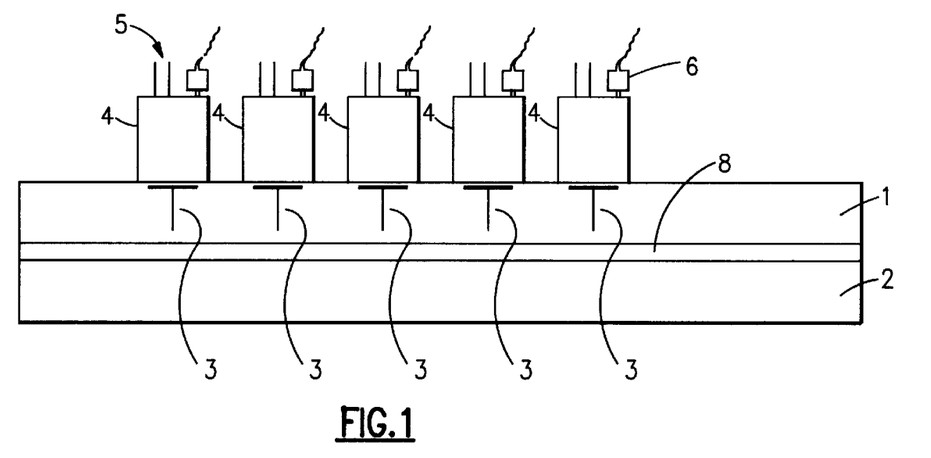
FIG. 1 represents a cross-sectional view of a die bar assembly for punching holes in a substrate.

FIG. 1 shows a cross-sectional view of an embodiment of a die bar assembly according to the present invention which may be utilized to punch holes in a substrate. The apparatus shown in FIG. 1 includes an upper die bar 1. The upper die bar houses a plurality of punches 3 that actually physically punch holes in a substrate. The substrate passes between the upper and lower portions of a die bar during the punching operation.

Figure 2:
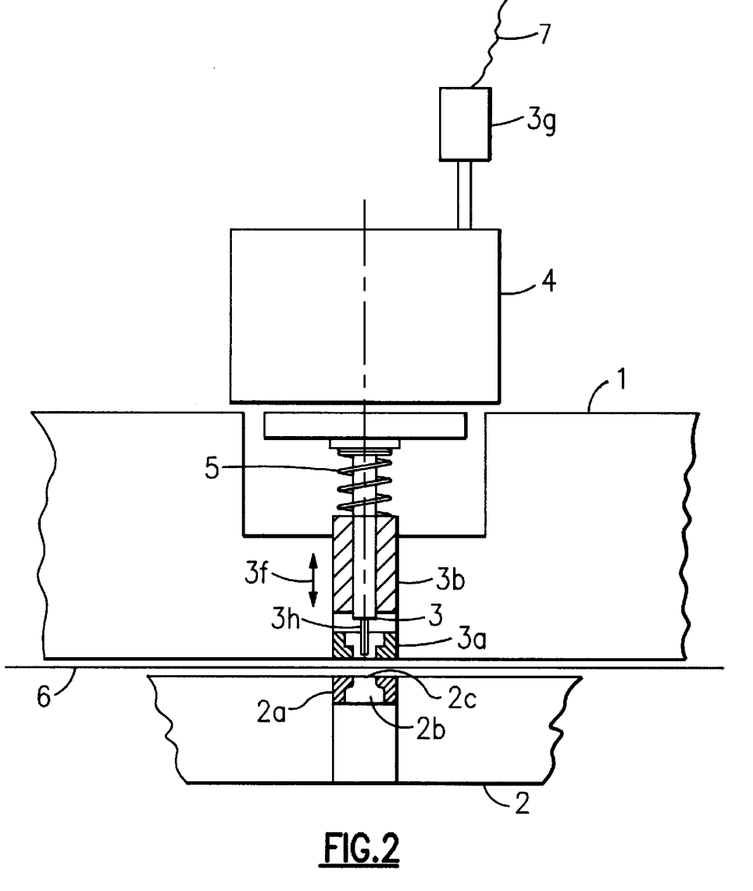
FIG. 2 represents a close-up view of an embodiment of a punch, driven by electromagnetic repulsion, in the die bar assembly according to the present invention.

FIG. 2 shows a close-up of a punch, actuation and guiding assembly of the die bar assembly shown in FIG. 1. In the close-up view shown in FIG. 2, punch guides 3a and 3b can be seen that guide movement of the punch 3.

The punch is actuated by a driving coil assembly 4 shown in FIG. 1 and in close-up in FIG. 2. The punches are directly propelled by electromagnetic repulsion forces generated between the coil and the copper disc at the rear of the punch. Leads leading away from the coil connect the coil to a driver circuit.

To actuate the punch, the driver circuit sends a current pulse down the leads to the coil. The current pulse generates a rapidly changing coil magnetic field. This field in turn generates intense eddy currents in the copper disc. The coil magnetic field interacting with the eddy currents repels the punch, propelling it downward.

Preferably, the punch is propelled downward with an extremely high accelerating force. According to one embodiment, the accelerating force on the punch is approximately 20 lbs. However, the downward force of the punch may be varied, depending, among other factors, upon the substrate being punched, for example. The arrows 3f indicate movement of the punch on its power stroke and return stroke.

As shown in FIG. 2, the punch assembly also includes a spring 5 for biasing the punch in an unextended upward direction. The spring returns the punch to its starting position after actuation. The force that the spring applies to the punch may be varied, depending upon the application. As discussed below, the force that the spring applies may also vary affect the transmission of vibrations from one punch to another.

As will also be discussed in greater detail below, the present invention may include an accelerometer 3g located at each punch assembly. As shown in FIG. 2, the accelerometer 3g may be located on the driving coil 4. The accelerometer detects movement of the punch.

The accelerometer 3g may be magnetically or mechanically attached to the driving coil. As such, the accelerometer senses both the accelerating force applied to the punch and the impact force of its return against the coil face. The forces on the coil are manifested as vibrational accelerations of the coil structure and are thus detected by the accelerometer.

The accelerometer 3g may include leads 7 for measuring the output showing acceleration forces detected by the accelerometer. To view a representation of the acceleration forces, the accelerometer may produce an output voltage corresponding to the acceleration forces detected. The output voltage may be viewed with respect to time, utilizing a measuring instrument. For example, the output voltage could be viewed using an oscilloscope or computer-based measuring system display, not shown.

The apparatus shown in FIG. 1 also includes a lower die bar 2 structure. FIG. 2 provides a close-up cross-sectional view of a portion of the lower die bar including a cutting die 2a. The cutting die 2a includes an interior passage 2b for receiving the punch. Cutting die 2a also includes a cutting surface 2c about the upper opening of the cutting die.

The punch 3 and cutting surface 2c of the cutting die 2 act together to form holes in a substrate placed between the upper die bar assembly 1 and lower die bar assembly 2. FIG. 2 shows a substrate 6 located between the upper die bar 1 and lower die bar 2.

As shown in FIG. 2, the driving coil will be energized, producing a magnetic field that repels the punch. The magnetic field causes the punch to travel downward through the guides and the guide dies. After exiting the guide dies, the punch then engages the substrate 6.

After engaging the substrate, the punch applies pressure to the upper surface of the substrate. The pressure applied to the substrate forces it onto the lower die 2a. The cutting surface 2c of the lower die 2a will cut the substrate as the pressure from the punch in the opening of the lower die increases. When the substrate is finally cut and a hole formed therein, the punch will pass into the passage 2b of the lower die 2a. Upon reaching its maximum extension, the punch will then be drawn back to its starting position by the return spring and the rebound momentum derived from the bounce of the punch off of the top of the punch guide.

Figure 4:
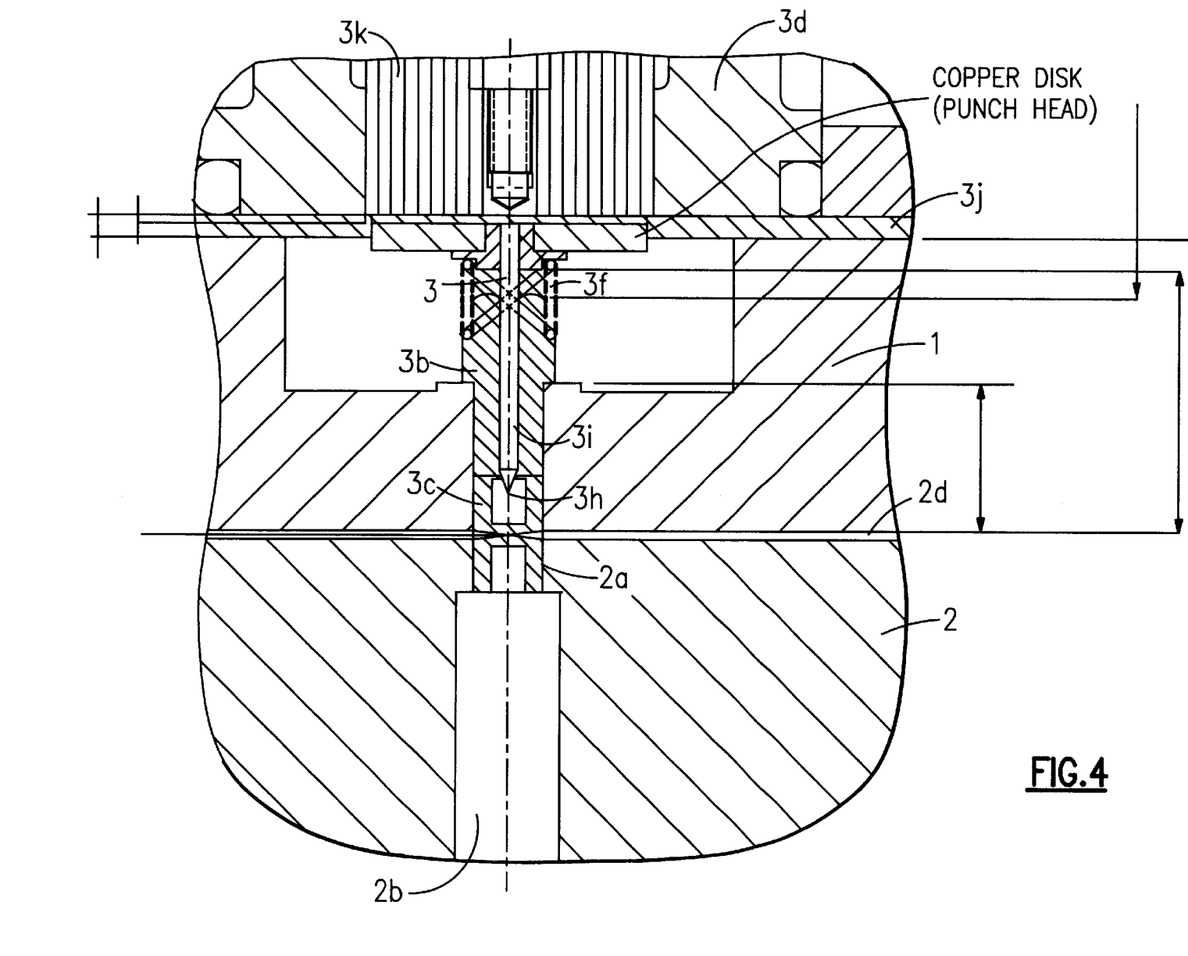

FIG. 4 illustrates a close-up cross-sectional view of an embodiment of an electromagnetic repulsion actuator that the present invention may be utilized with. In addition to the elements of the punch/actuator shown in FIG. 2, FIG. 4 also more clearly illustrates a gap 2d between the upper die bar segment 1 and the lower die bar segment 2. Also, FIG. 4 also more clearly illustrates the punch tip 3h and punch shaft 3i. Additionally, as shown in FIG. 4, a spacer 3j may be arranged between the coil and the upper die bar segment 1. The spacer 3j may be made of polycarbonate. Furthermore, FIG. 4 illustrates the coil ribbon winding 3k that may be included in the driving coil 3d.

Figure 3:
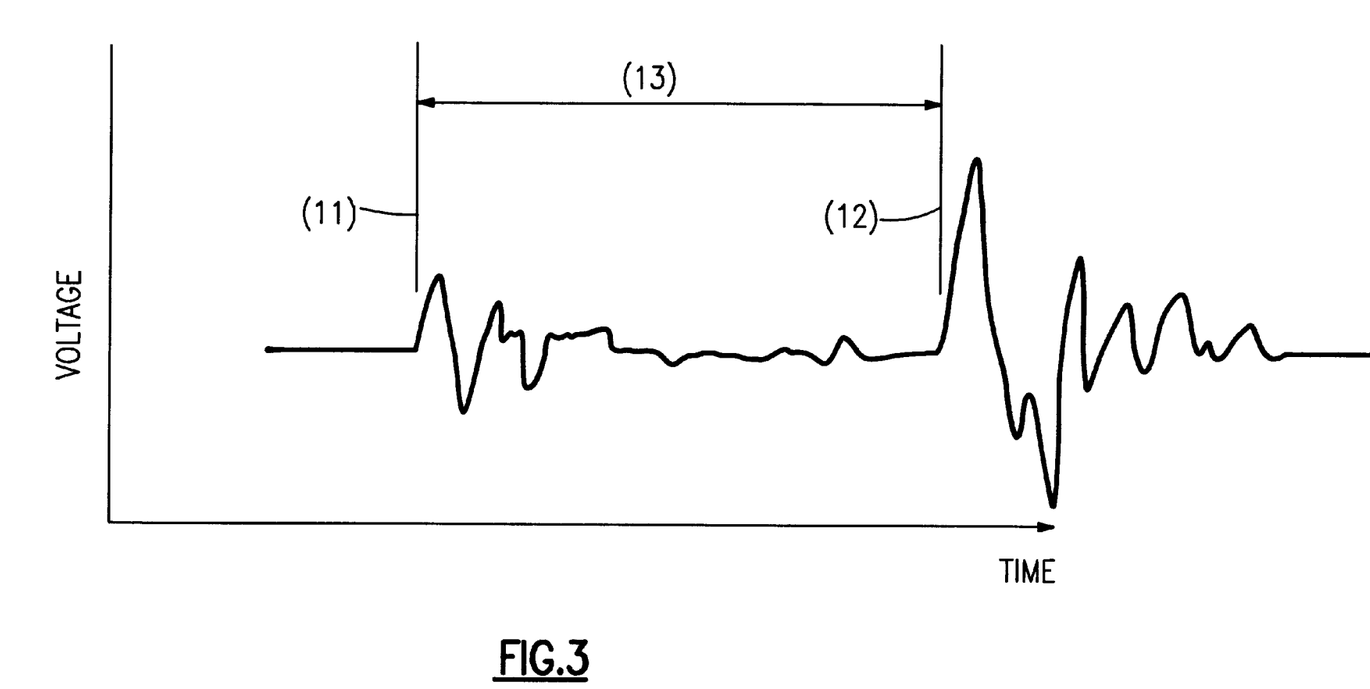
FIG. 3 represents a graph illustrating voltage versus time for the output of an accelerometer during one punch actuation cycle.

FIG. 3 represents an oscilloscope tracing that indicates the voltage produced by the accelerometer during one cycle of the punch shown in FIGS. 1 and 2. Line 11 indicates the start of the acceleration of the punch as the coil is energized. The impact of the punch on the substrate is indicated by line 12. The time interval between points 11 and 12 indicated by line 13 represents cycle time for a single punch cycle.

The above method may be utilized to punch holes in a substrate according to at least two different methods. According to one method, the "move stop punch" method, the die bar assemblies and the substrate in which the holes are being formed are approximately stationary with respect to each other during the hole punching operation. According to the "move stop punch" method, holes will be punched while the die bar assembly and substrate are approximately stationary. The substrate and/or the die bar assemblies will then be moved. The movement of the substrate and/or die bar assemblies will then be stopped again and holes punched again. This process is repeated until holes are formed in all desired locations.

Alternatively, holes may be punched while the substrate and die bar assemblies move relative to each other. In such punch-on-the-fly operations as described above, the substrate and/or the die bar assembly may be moved. In some instances, only the die bar assembly will move. According to other cases, only the substrate will move. According to still other cases, both the die bar assembly and the substrate may move.

Punch-on-the-fly operations are described as "punch-on-the-fly X" (POFX) or "punch-on-the-fly Y" (POFY), where X and Y refer to the Cartesian coordinate system used to describe the punch motion. During both POFX and POFY, there is a lateral component of punch motion relative to the web during the punch "web engagement time", or that time from when the punch contacts the substrate and begins to pierce the substrate to that time that the punch clears the web on its return to its starting position. As can be appreciated from the above, punch-on-the-fly operations make possible much faster punching rates as compared to move-stop-punch operations. However, if the "web engagement time" increases during punch-on-the-fly operations, the holes punched in the substrate will be deformed since the punch will move excessively relative to the substrate as either the substrate and/or the die bar assembly move.

As critical dimensions of components of electric circuits decrease, spacing between components and density of components increases. These factors increase the criticality of accurately forming holes in substrates such as circuitized films, as described above. For example, the apparatus shown in FIGS. 1 and 2 may be utilized to punch holes between about 0.004 and about 0.008 inches in diameter. An example of a substrate in which the apparatus may be utilized to form holes is a Kapton film.

Regardless of the type of substrate in which the above-described or other apparatus is used to form holes, and also regardless of the size of the holes formed, the punching operation will produce particles of the substrate, much as a saw blade produces sawdust. These particles will gather on surfaces of the punch, guide dies, and lower die. These particles will increase the frictional forces between the punch and the guide dies and lower die as the punch passes between the guide dies and the lower die.

Even though the particles may be microscopic, the particles can quickly cause a delay in movement of the punch. This is particularly true when dealing with the tight tolerances of the punch guiding system involved in forming densely packed, small holes. In fact, the particles can cause the punch to experience a significantly delayed return and even to fail to return. Clearly, any delay in punch return, particularly during punch-on-the-fly operations, can result in hole elongation, particularly in punch on the fly operations. In some cases, the delay in punch return, or sticking of a punch can result in a ripped web when the substrate and/or punch assembly moves.

Although punches experiencing a delayed return may represent only about 5% of the total punches of a job, if any punch causes a significant delay, thereby causing the web to tear, the entire job may have to be discarded and restarted. Clearly, such occurrences will greatly increase time and expense and result in a waste of materials as well.

In view of the above, the inventors of the present invention recognized that it would be desirable to have a means of measuring punch cycle time and, in particular, of detecting punch delay and, thereby ensure that the holes meet quality standards. In particular, the inventors of the present invention realized that it would be desirable to have means of detecting punch "web engagement time" and other punch parameters and whether the "web engagement time" exceeds a predetermined value.

Of course, the amount of time delay can vary, depending upon the characteristics of the material being punched, such as strength and elasticity, the speed of movement of the punches and substrate relative to each other, among other factors. For a typical web clamping and support system, a change of about 500 $\mu$s in the web engagement time can cause significant hole quality problems with a punch to web relative velocity of about 10.0 mm/s. Of course, one skilled in the art could determine the acceptable amount of delay for a given system and web without undue experimentation once aware of the present disclosure.

To develop a method and apparatus for overcoming punch delay problems, the inventors monitored punches and cycle times. The inventors found that the typical "in web time" is proportional to the total cycle time of the punch. Typically, the "in web time" occupies about 66% of the total cycle time of a punch. The cycle time includes the time from when the punch at rest against the driving coil prior to being actuated, through actuation of the punch by the driving coil, penetration of the substrate by the punch, extension of the punch to its most extended point, and return of the punch back through the substrate to the initial impact of the punch against the coil at the starting position.

A typical total cycle time of an apparatus such as that shown in FIGS. 1 and 2 is about 600 to about 700 microseconds. The coil accelerates the punch to the velocity of approximately 80.0 to approximately 100.0 inches per second. According to one embodiment, this velocity is achieved in about 70 microseconds. The total cycle time for the punch may be from about 600 to about 800 microseconds, while maintaining good hole quality.

In an embodiment of an apparatus according to the present invention as shown in FIGS. 1, 2, and 3, the punch may travel about 31 mils (0.031 inch) down to its fully extended position. The punch returns approximately the same distance back to the starting position. The "web engagement time" may be from about 400 to about 500 microseconds.

When punch-on-the-fly operations are utilized, typically, the punch is moved with respect to the substrate. The punches may be mounted on a table. According to one embodiment, the table moves at a velocity of about 0.5 inches per second (about 12 mm/s). Such a table velocity moves the table approximately 0.0002 inch (0.2 mils) with respect to the substrate during the "in web time".

Of course, the above values are only illustrative of a few examples of one punching operation on one apparatus. Other values may apply to other apparatuses and processes. One skilled in the art, once aware of the present disclosure could determine the relevant values for other apparatuses and processes without undue experimentation.

As a result of the relative motion of the substrate with respect to the punches, a force develops between the punch the substrate at the periphery of the hole in which the punch is engaged. Although the punch engages the substrate during the movement of the punch and/or substrate, the relatively small motion typically can be accommodated elastically without significant distortion in the substrate. However, lengthening of the cycle time, particularly where the buildup of substrate particles on the punch and die surfaces causes increase "in web time", the "in web time" may lengthen, increasing the lateral motion of the substrate and punch relative to each other during the "in web time".

In instances when the delay in punch movement becomes too great, increasing lateral motion cannot be accommodated elastically using typical web clamping and suspension methods. This results in hole elongation and deformation. Ultimately, if the punch is slowed down enough, the punch will tear the web as the web and punch move relative to each other.

For example, if the relative motion of the punch and table increased to about 0.4 mils, the holes may elongate, deform, and the web possibly tear in the example cited above. Hole deformation can not only result in defects to the substrate, but deformed holes may also result in plating defects in subsequent processing. Therefore, the implications of problems with punch movement may be very wide ranging.

According to one embodiment in which the normal cycle time is about 600 to about 800 microseconds, if the cycle time deteriorates to about 2 to about 5 milliseconds, the substrate or web may tear. Alternatively, if the engagement time or "in web time" reaches about 800 to about 1000 microseconds, the holes will elongate utilizing a table speed of about 0.5 inches per second.

The inventors of the present invention have extensively studied the operation of punches and determined that a consistent pattern exists leading up to punch failure and substrate tearing. The slow down of the punch cycle times may occur over thousands of punch cycles. Over time, the degree of variability in hole deformation as a result of the slow down of the punch cycle time may increase. Eventually, the substrate may tear.

If The present invention addresses problems of hole deformation and substrate tearing during punching of holes in the substrate by providing a method and apparatus for detecting variations in punch operation. By monitoring the punches, the present invention may determine the existence of deterioration in performance well before destruction of a substrate or web.

The present invention detects degradation in punch performance and conditions leading to deformation of holes and potential destruction of substrate by monitoring parameters related to punch performance. Punch cycle times may be measured by incidents of acceleration forces between the punches and coils. The resulting coil acceleration values themselves may also be monitored to determine punch performance.

Punch acceleration and/or timing provide information regarding coil and punch performance. Thereby, the present invention may monitor hole quality with respect to hole elongation without having to resort to time-consuming and costly microscopic examination of the holes formed in the substrate.

To precisely determine the condition of all punches in a punch assembly independently of each other, an apparatus for carrying out methods of the present invention may include an accelerometer mounted on each punch coil or some other portion of the punch assembly related to each punch. Mounting an accelerometer on, interconnected with or in the vicinity of, each punch or punch assembly may require mechanical decoupling of the coils and associated accelerometers and punches, one from another, to isolate them so as to precisely sense the desired characteristics regarding the punch, such as punch cycle time and punch accelerating force. By mechanically decoupling the punch actuators, the transmission of mechanical vibrations from one to another is minimized, thereby enabling the measurement of forces on each punch.

The mechanical decoupling of the punch actuators may be carried out according to a variety of strategies. For example, each punch actuator may have an accelerometer directly mounted on the coil that provides the accelerating force on the punch. According to such an embodiment, the accelerators may be rigidly mounted to the respective coil to maximize sensitivity of the accelerometers to the vibrational motions of the coil on which they are mounted.

If an accelerometer is mounted to or in connection with each punch or punch assembly, the number of accelerometers will, of course, be dependent upon the number of punch positions and coils. As discussed above, once the punch is actuated, engages and punches the substrate, returns to its starting position, it experiences a variety of acceleration forces. As shown in FIG. 3, these acceleration forces may be analyzed to determine the location of the punch at various points in its travel, therefore, delays in the punch movement may be detected. The coil accelerations of importance are the result of action-reaction force couples between the coil and punch.

According to another embodiment, the punch actuators are mechanically decoupled by constructing the mounting of the coil on the punch tool such that transmission of vibration to neighboring punches is minimized. One means for carrying out such a mounting of the coil is accomplished by utilizing a low spring rate coupling between the coil and the rest of the punch tool. This strategy may also increase the amplitude of the coil self vibration during each actuation, thus increasing the signal amplitude to the accelerometer mounted on the coil. Such a mounting of the punch tool, of course, would be carried out in conjunction with individual mounting of accelerometers. The mounting of the coil may help to isolate each coil from the others thereby enhancing the operation of the accelerometers in their detection of acceleration forces that the punch experiences.

According to a third embodiment, the mounting of the coil may be constructed such that vibrations from adjacent punch positions are not coupled well into the actuator, or coil, structure. According to such embodiment, the coil may thus not be very sensitive to vibrations in the punch tool resulting from other punch positions.

As stated above, the accelerometers, such as piezoelectric accelerometers, may produce an output voltage corresponding to the acceleration they detect. The value of the voltage may indicate the location of a punch and on that basis provide the ability to determine length of punch cycles. According to one embodiment, an actuation voltage of about 2 volts is generated by the accelerometer upon actuation of the punch using an accelerometer with a sensitivity of about 5 mV/g. The impact voltage generated by the accelerometer as the punch returns and impacts the coil and spacer is about 7 volts. The voltage levels for other portions of the punch cycle may be determined. The time between the various voltages may be measured and then changes from predetermined desired time values calculated. of course, regardless of the voltage values at each point, the method described above for determining location of the punch may be used.

According to an embodiment, in which the normal punch cycle time was about 600 to about 800 microseconds, if the time between actuation and return of the punch exceeded a predetermined value of about 1000 microseconds, a stop command was sent to the machine control circuit. The machine then stopped the punch tool, regardless of where in a run the punch tool was. For example, the machine could be stopped between punch frames. With an accelerometer positioned on each punch, the position or positions with deteriorated performance could be determined and these punches serviced.

The measurement of the accelerometer signal may be performed with an analog-to-digital converter having appropriate measurement voltage range and resolution. The digital output of the converter may be stored electronically at rates consistent with accurate characterization of the signal waveform. The time interval during which the signal is measured and stored can, for example, be controlled by defining the number of digitized examples to be measured and a digitization rate for each waveform acquisition and by triggering the measurement event in a manner similar to that used in digital storage oscilloscopes. Signal amplitude, frequency, and phase characteristics may be used to define the triggering of each measurement event.

After digitization and storage, the waveform may be analyzed for characteristic features defined by the actuator cycle. Therefore, characteristic timing of intervals between events within the actuation cycle can be determined. This analysis may be accomplished by a person viewing a waveform, such as that displayed by an oscilloscope trace or by using electronic hardware, firmware, and/or software to identify the waveform character features and associated time intervals. As discussed above, once the intervals are determined, it may be determined whether punch performance has been degraded and whether servicing is required.

In some instances, modifying the actuator design may facilitate the signal measurement and waveform analysis. For instance, when using an accelerometer as a sensor, the mechanical coupling of the actuator coils to the die bars is very important in controlling the "signal-to-noise" ratio. "Cross-talk" between adjacent actuator positions can occur if the mounting of the actuator coils is too rigid. The vibrations generated by adjacent positions can confuse the waveform measurement and analysis. Hence, as described above, apparatus according to the present invention preferably include means for minimizing and/or preventing crosstalk by isolating the actuator positions and accelerometers.

Figure 5:
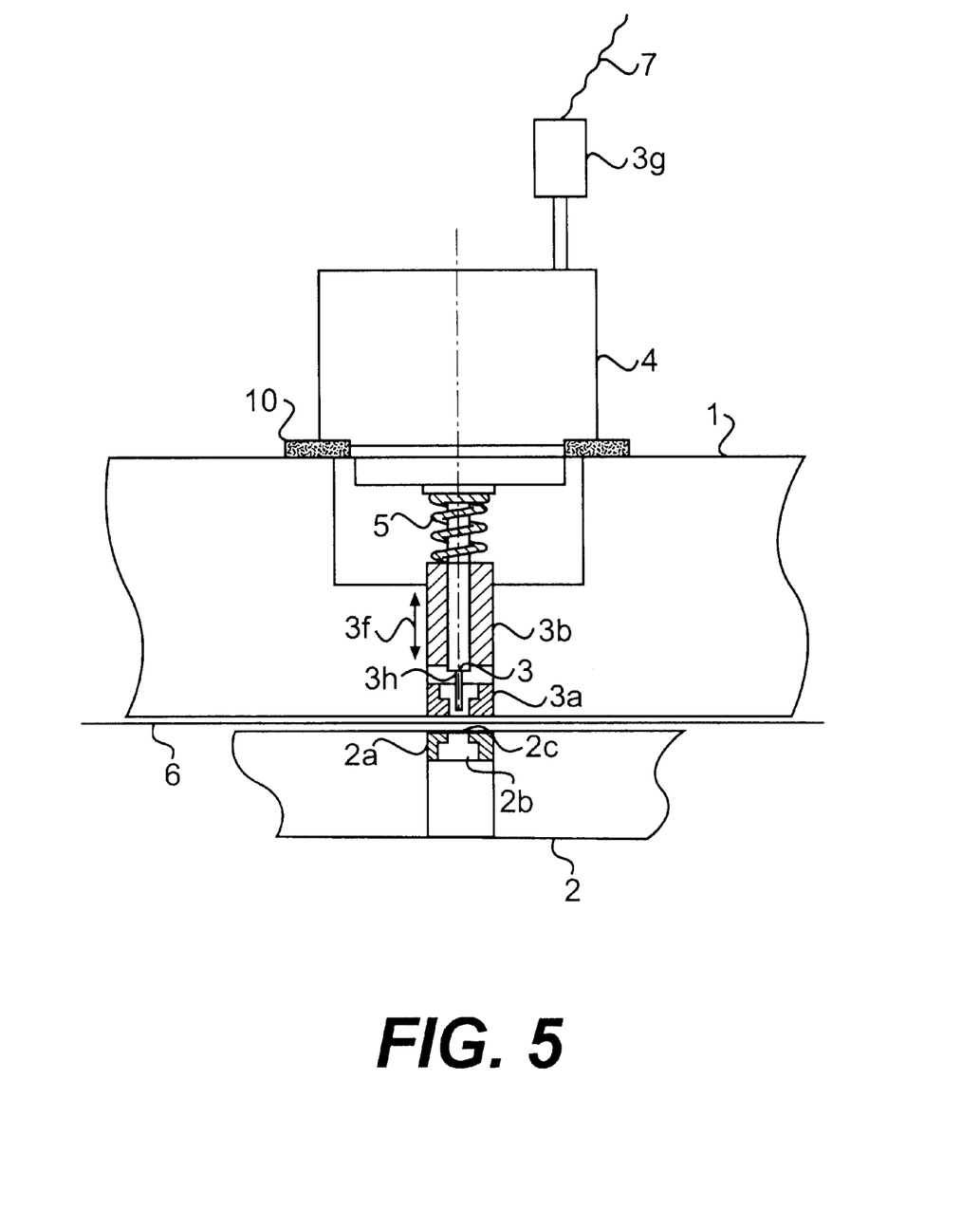
FIGS. 5 and 6 represent embodiments of the present invention shown in FIGS. 2 and 4, respectively, including elastomeric mounting elements.
Figure 6:
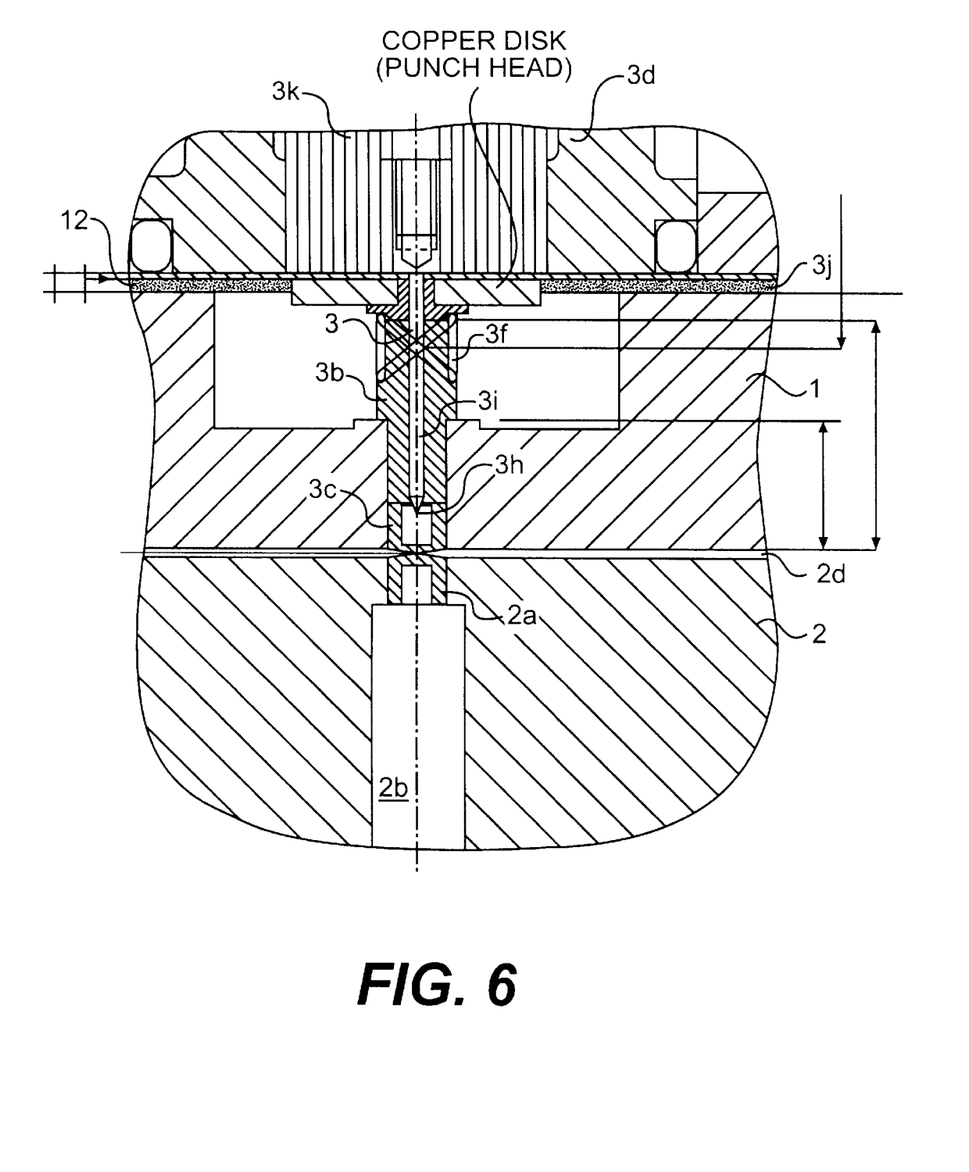

For example, the signal-to-noise ratio is dramatically improved and successful measurement and analysis is enabled by changing from rigid steel to spring-loaded compliant mounting screws for the actuator coils. Similarly, elastomeric mounting and/or dampening actuator components may also help to reduce the signal-to-noise ratio and isolate the various actuator positions FIGS. 5 and 6 illustrate elastomeric mounting and/of dampening actuator components 10 and 12, respectively.

In some instances, even though punch performance degradation has been detected, it may be desirable to postpone a servicing if processing of a substrate is nearly complete. This may be the case particularly if it is early in the slow and progressive deterioration of performance described above. Accordingly, an apparatus according to the present invention may include a bypass for preventing automatic shutdown of a punching operation.

However, if punch performance deteriorates beyond a maximum predetermined point, the apparatus may automatically shutdown, wherein such automatic shutdown may not be bypassed. According to one embodiment, with an average cycle time of between about 600 and about 800 microseconds, the mandatory shutdown point may occurs at about a 1200 microsecond cycle time. Such an automatic shutdown may greatly decrease the likelihood of substrate tearing. In other words, beyond a certain cycle time, the probability of substrate tearing becomes very high.

Examples of substrates that may be punched with an apparatus according to the present invention include polyimide films manufactured by DuPont and available under the tradename KAPTON. Typical films that may be punched with an apparatus according to the present invention may have a thickness of from about 25 to about 50 $\mu$m.

The automated punch and analysis of the punch actuator waveform according to the present invention may be used for a variety of purposes. For example, the apparatus and method of the present invention may be utilized to alert operators to marginal actuator performance. Additionally, the present invention may be utilized to stop the punch tool and avoid malfunctions such as rips in a substrate. The present invention may also provide feedback to provide for control of applied actuator energy or other machine tool parameters, such as table and/or die bar velocity.

Accelerometers utilized according to the present invention may also provide more orderly and less cumbersome apparatus than an apparatus that would utilize optical sensors to detect punch firing and/or position.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A method for improving quality of a substrate processed by punch assemblies, each punch assembly comprising a punch and a punch actuator for punching holes in a substrate, the method comprising:
   connecting accelerometers to said punch assemblies;
   sensing operational characteristics of said punch assemblies with said accelerometers; and
   detecting a degraded performance of at least one of said punch assemblies based on said sensed operational characteristics.

2. The method according to claim 1, further comprising:
   utilizing a low spring rate coupling between a force generating component of a punch tool and a remaining portion of the punch tool.

3. The method according to claim 1, wherein an accelerometer of said accelerometers is mounted on each punch actuator for measuring accelerating force on each punch actuator as a function of time.

4. The method according to claim 3, mounting each of said accelerometers rigidly to one of the punch actuators.

5. The method according to claim 3, mounting said accelerometers directly on a coil of the actuator to thereby maximize the sensitivity of the accelerometers to vibrational motions of the coil on which they are mounted.

6. The method according to claim 1, further comprising the step of:

individually sensing characteristics of the punch actuators.

7. The method according to claim 6, wherein said characteristics include at least one member selected from the group consisting of punch cycle time and punch accelerating force.

8. The method according to claim 1, wherein the accelerometers sense operational characteristics of the punch actuators by detecting at least one of vibrations resulting from movement of the punch actuators and vibrations resulting from movement of punches actuated by the punch actuators.

9. An apparatus for mechanically forming holes in a substrate, comprising:

a plurality of punch assemblies each comprising a punch for engaging the substrate and forming holes in the substrate and a punch actuator for actuating the punches; and means for sensing operational characteristics of the punch assemblies comprising accelerometers connected to the punch assemblies.

10. The apparatus according to claim 9, wherein an accelerometer is connected to one of each punch and each punch actuator for sensing acceleration forces on one of each punch and each punch actuator.

11. The apparatus according to claim 10, wherein each of said accelerometers is rigidly mounted to one of each of said punches and each of said punch actuators.

12. The apparatus according to claim 10, wherein said accelerometers are directly mounted on a coil of the actuators.

13. The apparatus according to claim 9, said accelerometers sensing characteristics of the actuation of the punch actuators.

14. The apparatus according to claim 9, further comprising:

elastomeric mounting components and dampening components for mounting the punch actuators and dampening movements of the punch actuators with respect to other punch actuators.

15. The apparatus according to claim 9, wherein the accelerometers sense operational characteristics of the punch actuators by detecting at least one of vibrations resulting from movement of the punch actuators and vibrations resulting from movement of punches actuated by the punch actuators.

* * * * *

UNITED STATES PATENT AND TRADEMARK OFFICE
CERTIFICATE OF CORRECTION

PATENT NO. : 6,305,258 B1
DATED : October 23, 2001
INVENTOR(S) : Donald W. Henderson et al.

It is certified that error appears in the above-identified patent and that said Letters Patent is hereby corrected as shown below:

<u>Column 7,</u>
Line 43, delete "If"

Signed and Sealed this

Twenty-fifth Day of June, 2002

*Attest:*

*Attesting Officer*

JAMES E. ROGAN
*Director of the United States Patent and Trademark Office*